(12) United States Patent
Ong et al.

(10) Patent No.: US 10,032,500 B2
(45) Date of Patent: Jul. 24, 2018

(54) MEMORY DISTURB RECOVERY SCHEME FOR CROSS-POINT MEMORY ARRAYS

(71) Applicant: Kilopass Technology, Inc., San Jose, CA (US)

(72) Inventors: Adrian E. Ong, Pleasanton, CA (US); Charles Cheng, Los Altos, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

(21) Appl. No.: 15/289,023

(22) Filed: Oct. 7, 2016

(65) Prior Publication Data

US 2018/0102159 A1  Apr. 12, 2018

(51) Int. Cl.
*G11C 11/34* (2006.01)
*G11C 11/39* (2006.01)
*G11C 15/04* (2006.01)

(52) U.S. Cl.
CPC ............. *G11C 11/39* (2013.01); *G11C 15/04* (2013.01)

(58) Field of Classification Search
CPC ................................ G11C 11/39; G11C 15/04
USPC ........................................................ 365/180
See application file for complete search history.

(56) References Cited

U.S. PATENT DOCUMENTS

| | | | | |
|---|---|---|---|---|
| 2005/0240745 | A1* | 10/2005 | Iyer | G06F 12/0223 711/167 |
| 2010/0002482 | A1* | 1/2010 | Dhong | G11C 15/04 365/49.17 |
| 2013/0229855 | A1 | 9/2013 | Kwak et al. | |
| 2014/0025866 | A1 | 1/2014 | Kim et al. | |
| 2016/0329094 | A1 | 11/2016 | Luan | |
| 2017/0117030 | A1* | 4/2017 | Fisch | G11C 11/4087 |

\* cited by examiner

*Primary Examiner* — Tha-O H Bui
(74) *Attorney, Agent, or Firm* — Aka Chan LLP

(57) ABSTRACT

Methods and systems are described herein for determining if bit cell read or write rates require a refresh of the accessed or neighboring bit cells. The refresh of VLT memory bit cells that undergo a high frequency of page address read operations and write operations helps to maintain integrity of data stored in the VLT memory bit cells. The methods and systems determine, during each RAS cycle, if a rate of Page Address read operations or write operations exceeds a maximum rate across an interval, and conditionally cause a refresh operation if the rate exceeds the maximum rate. The methods and systems output a write back signal to cause a refresh of the associated VLT memory bit cells to prevent corruption of data stored in the associated VLT memory bit cells.

11 Claims, 5 Drawing Sheets

MEMORY DISTURB RECOVERY SCHEME FOR CROSS-POINT MEMORY ARRAYS

FIELD OF THE DISCLOSURE

This disclosure relates generally to Random Access Memory (RAM), and more particularly to recovery and/or refresh of data stored in memory bit cells in cross-point memory arrays.

BACKGROUND OF THE DISCLOSURE

During high rates of access (e.g., during write operations or read operations), selected or neighboring memory bit cells may be disturbed such that stored states (e.g., "on"/ "off" states, low resistance/high resistance states, conductive/resistive states) of the memory bit cells may not be recoverable. Repeated access of a memory bit cell within an array may disturb one or more neighboring memory bit cells, causing the one or more neighboring bit cells to change states. For example, repeated read or write operations to a memory bit cell may cause neighboring memory bit cells (e.g., sharing a common word-line or a common bit-line) to change from an "off" state to an "on" state. Accordingly, disturb recovery techniques are needed to refresh data in the memory array and avoid corruption of stored data.

SUMMARY OF THE DISCLOSURE

Methods and systems are described herein for determining if a rate of access operations (e.g., read or write operations) on a number of bit cells (e.g., corresponding to a page address) require a refresh of the accessed or neighboring bit cells (e.g., within a same page or neighboring page of a memory device). The refresh of memory bit cells that undergo a high frequency of page address read operations and write operations helps to maintain integrity of data stored in the memory bit cells. The methods and systems determine, during an access cycle (e.g., an RAS cycle), if a rate of page address read operations and/or write operations exceeds a maximum rate across an interval (e.g., a multiple of a duration of an access cycle that corresponds to a relaxation time of a memory bit cell), and conditionally cause a refresh operation if the rate exceeds the maximum rate. The methods and systems output a write back signal to cause a refresh of memory bit cells associated with a frequently accessed page address to prevent corruption of data stored in the associated memory bit cells.

The methods and systems may use a first FIFO device and a CAM device in order to count a number of times that an access operation has been performed on a page address. In some embodiments, the CAM device may include or be connected to a second FIFO device different from the first FIFO device. The methods and systems may compare a page address received in a current access cycle to a page address that was accessed immediately prior (e.g., that was accessed during an immediately preceding access cycle), and access data from a page buffer instead of the memory device, to avoid stressing the memory device.

BRIEF DESCRIPTION OF THE DRAWINGS

Further features of the subject matter of this disclosure, its nature and various advantages, will be apparent upon consideration of the following detailed description, taken in conjunction with the accompanying drawings, in which like reference characters refer to like parts throughout, and in which.

DETAILED DESCRIPTION OF THE DRAWINGS

Figure 1:
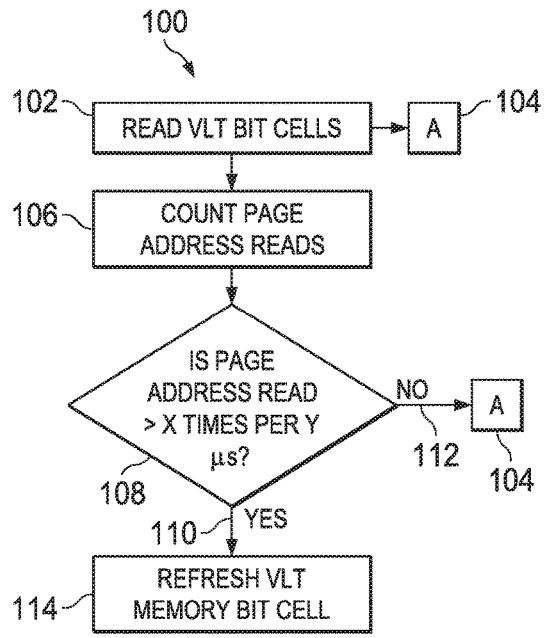
FIG. 1 depicts a flowchart of a process for determining if a read rate of an memory address requires refresh of memory cells associated with the memory address, according to an illustrative implementation.

Recent advancements in new memory technologies have properties that facilitate implementation in a cross-point architecture design (e.g., memory cells in a cross-point array can be uniquely selected without the use of one or more select transistors per memory cell, as required for DRAM or SRAM devices). Among them are Conductive-Bridging RAM (CBRAM), Memristor RAM, and Vertical Layer Thyristor RAM (VLT-RAM).

VLT-RAM is a type of memory technology that may be suitable for implementation in a cross-point memory array. Advantages of thyristors include the ability to precisely tune operating characteristics (e.g., switching speed, static power consumption, dynamic power consumption, etc.) by tuning the geometry and composition of component layers of each thyristor cell. VLTs may be arranged as an array of minimum $4F^2$ cells, thereby minimizing cell area and reducing fabrication cost. VLTs may also be arranged in a stacked configuration to further increase the density of memory cells in a cross-point array.

VLT-RAM may suffer from spontaneous memory loss during high read or write rates, during which a state of a VLT memory bit cell degrades. As referred to herein, the terms "memory cell," "memory bit cell" and "bit cell" may be understood to be a minimum cell of a type of memory technology that can be implemented within a memory array. This may happen when a VLT bit cell is accessed at a high rate (e.g., accessed at an interval that is shorter than a relaxation interval of a VLT bit cell). When a VLT bit cell is accessed at a rate that is faster than a relaxation time of the VLT bit cell, the VLT bit cell may change from an "Off" state to an "On" state. The access rates that induce bit cell degradation may be affected by the number of times a page address corresponding to one or more bit cells is accessed during operation of a cross-point memory array. Relaxation time of a VLT bit cell may vary depending on physical parameters of the VLT bit cell (e.g., doping profiles, geometric, etc.). A full relaxation time of a typical VLT memory cell may be approximately 3 µs. The minimum page cycle time (e.g., time required to access data from a page) may be 60 ns. Thus at this 60 ns cycle time and 3 µs relaxation time, a minimum of 50 different page addresses may be accessed within 3 μs without disturbing the accessed or neighboring VLT bit cells. In some examples, the neighboring bit cells may be disturbed as a result of different disturb conditions than the accessed VLT bit cells. These conditions may include cell to cell coupling, half select current and/or voltage levels, and other disturb conditions. If fewer than 50 different page addresses are accessed, (e.g., indicating that at least one page has been accessed twice within the 3 μs relaxation time), then an accessed or neighboring VLT bit cells may experience disturb effects and/or degradation. However, access rates may be monitored to ensure that if a page address is being used more than a maximum number of times within a relaxation period, the memory bits associated with the page address, and/or neighboring memory bits, are refreshed. Even if VLT bit cells have degraded, they may still be readable and/or recoverable and can be refreshed to prevent non-recoverable memory loss.

FIG. 1 depicts a flowchart of a process 100 for determining if a read rate of a memory address requires a refresh of memory cells associated with the memory address, according to an illustrative implementation. Process 100 may be executed by a Finite State Machine (FSM), ASIC, processor, CPU, microcontroller, or other memory control circuitry that may be in signal communication with the cross-point memory array (e.g., control circuitry on the same semiconductor substrate as, or on a separate semiconductor substrate from the cross-point memory array). Process 100 may begin at 102, when a page address is received and VLT bit cells associated with the page address are read. Process 100 may then count the number of times a page address has been read at 106, which may correspond to counting the number of times VLT bits associated with the page address are accessed. For example, process 100 may count the number of times that a page address has been read in a prior 50 access operations. The counting mechanism may be further described by FIGS. 3-7. Based on the counting result determined at 106, process 100 may determine if the page address has been read more than X times per Y μs at 108, where X may be the maximum number of times VLT memory bits associated with the page address can be read within the Y μs time. For example, Y may be 6 μs (e.g., a multiple of or a number greater than a relaxation time of a VLT bit cell). For example, Y may be in a range from 1 us to 10 us. For example, X may be in a range from 10 to 100 read operations.

If, at 110, the process 100 has determined that the page address read rate exceeds a rate of X/Y (e.g., by determining that the number of times that the page address has been read exceeds X times per Y seconds), process 100 may proceed to 114 and refresh the VLT memory bit cells associated with the read page address. For example, process 100 may read data from the VLT bit cells, and write the read data back to the VLT bit cells. For example, process 100 may perform a read operation on a page, associated with a page address, from a memory device to read data from the page into a page buffer, write back data from the page buffer to the page corresponding to the page address. In some embodiments, at 114, process 100 may wait for a period of time that is equal to or a fraction of the relaxation time of the VLT memory bit cell, before refreshing the VLT memory bit cell. In some embodiments, at 114, process 100 may wait for a period of time that is equal to or a fraction of the relaxation time of the VLT memory bit cell, while refreshing the VLT memory bit cell (e.g., waiting the period of time between reading data from the page to the page buffer and writing data from the page to the page buffer).

If, at 112, process 100 determines that the page address read rate has not exceeded a rate of X/Y, then process 100 may proceed to 104, and may continue to receive a page address and read VLT bit cells associated with the received page address. Process 100 may continue for the duration of the Y μs time. At the end of the Y μs time, the counter at 106 may re-initialize its count to 0. This may be described in further detail with relation to FIGS. 3-7.

Figure 2:
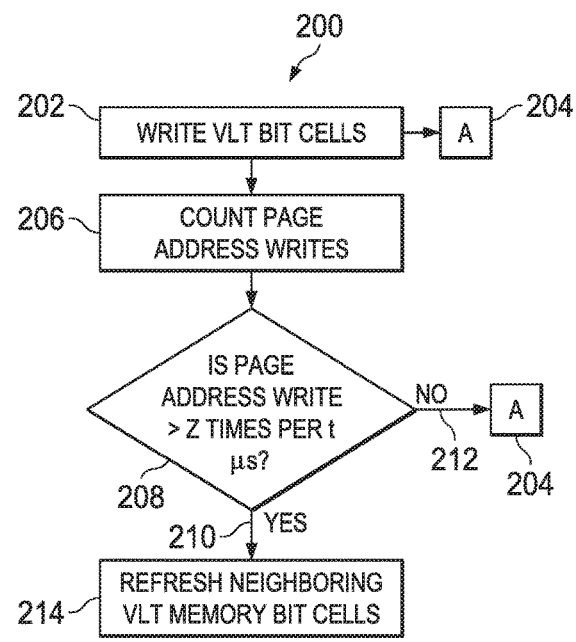
FIG. 2 depicts a flowchart of a process for determining if a refresh operation is required based on a rate at which a page address is written, according to an illustrative implementation.

FIG. 2 depicts a flowchart of a process 200 for determining if a write rate of a memory address requires a refresh of memory cells associated with the memory address, according to an illustrative implementation. Process 200 may be executed by a FSM, ASIC, processor, CPU, microcontroller, or other memory control circuitry, which may be in signal communication with the cross-point memory array (e.g., control circuitry on the same semiconductor substrate as, or on, a separate semiconductor substrate from the cross-point memory array). Process 200 may be started at 202, when a page address for writing is received, and when VLT bit cells associated with the page address are written. Process 200 may then count the number of times a page address is written at 206, which may correspond to counting the number of times VLT bits associated with the page address are accessed. The counting mechanism may be further described by FIGS. 3-7. Based on the counting result determined at 206, process 200 may determine if the page address has been read more than Z times per t μs at 208, where Z may be the maximum number of times VLT memory bits associated with the page address can be written within the t μs page cycle time without disturbing neighboring VLT memory bit cells. The neighboring VLT memory bit cells may be associated with a page address other than the page address being written at 202. The neighboring VLT memory bit cells may be bit cells along un-selected Word Lines (WLs) that are adjacent to the bits on the selected WL associated with the N-bit page address, such as N-bit page address 302. In this example, where N-bit page address 302 is selected, the page addresses±1 (not shown) in the order of selected page addresses may be refreshed. In this example, a FSM, ASIC, processor, CPU, microcontroller, or other memory control circuitry may issue two new RAS cycles to refresh the ±1 page addresses. t may be 60 ns, and Z may be 10. Z may be in a range from 10 to 100 writes. t may be in a range from 1 us to 100 us.

If, at 210, the process 200 has determined that the number of page address writes has exceeded a rate of Z/t, process 200 may proceed to refresh the neighboring VLT memory bit cells of the VLT memory bit cells being written to at 202. Neighboring VLT memory bit cells may be within 1 to 3 bits of the written VLT memory bit cells in a VLT memory array. For example, process 200 may read data from the neighboring VLT bit cells, and write the read data back to the neighboring VLT bit cells. For example, process 200 may perform a read operation on a page, associated with a page address of the neighboring bit cells, from a memory device to read data from the page into a page buffer, write back data from the page buffer to the page corresponding to the page address of the neighboring bit cells. In some embodiments, at 214, process 200 may wait for a period of time that is equal to or a fraction of the relaxation time of the VLT memory bit cell, before refreshing the VLT memory bit cell. In some embodiments, at 214, process 200 may wait for a period of time that is equal to or a fraction of the relaxation time of the VLT memory bit cell, while refreshing the VLT memory bit cell (e.g., waiting the period of time between reading data from the page to the page buffer and writing data from the page to the page buffer).

If, at 212, process 200 determines that the page address write rate has not exceeded Z/t, then process 200 may proceed to 204, and may continue to receive a page address for writing and write VLT bit cells associated with the received page address. Process 200 may continue for the duration of the t μs page cycle time. At the end of the t μs page cycle, the counter at 206 may re-initialize its count to 0. This may be described in further detail with relation to FIGS. 3-7.

Figure 3:
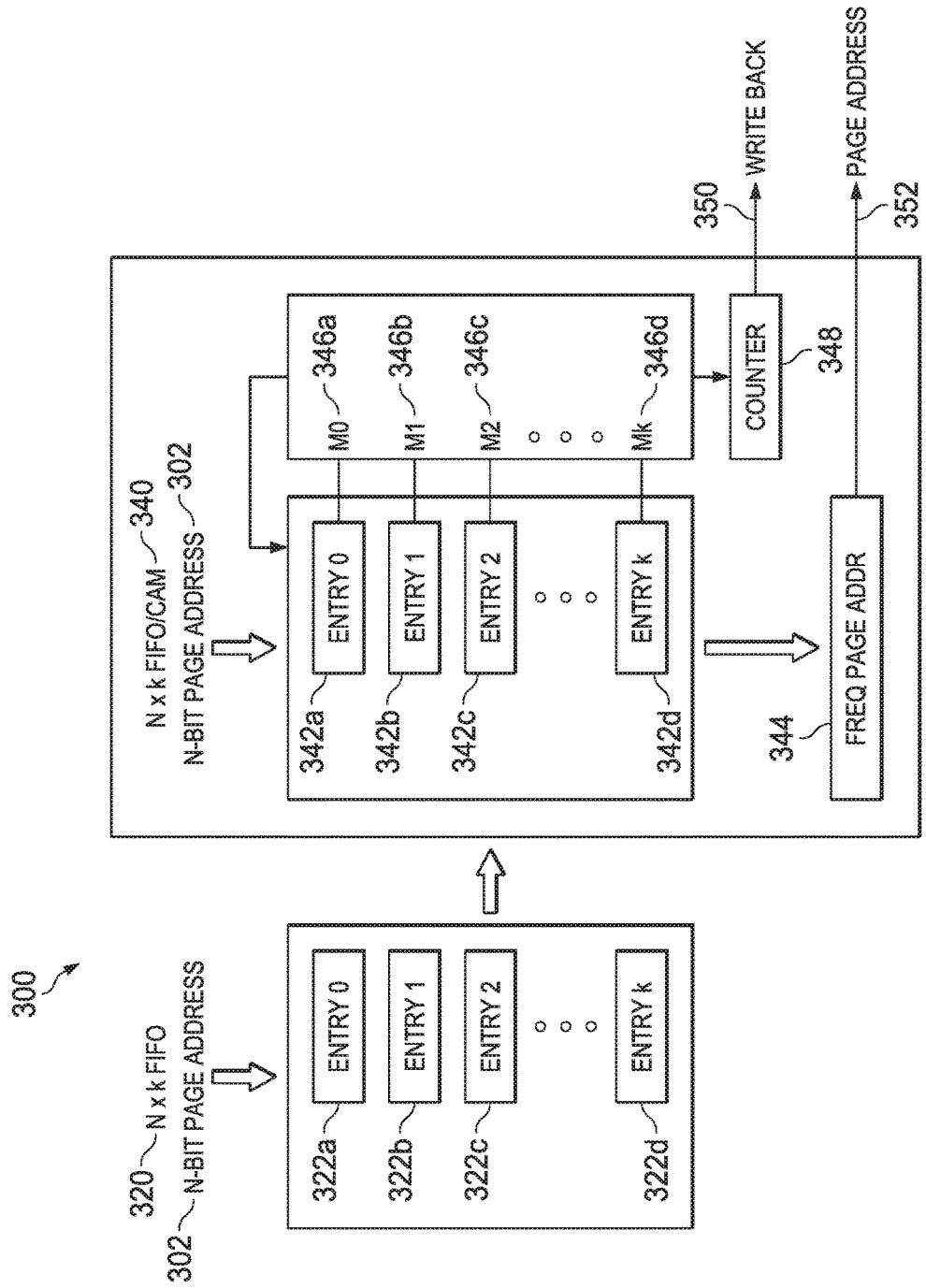
FIG. 3 depicts an apparatus for determining read rates or write rates, according to an illustrative implementation.

FIG. 3 depicts an apparatus 300 for determining read rates and/or write rates, according to an illustrative implementation. In some embodiments, apparatus 300 may be used to determine read rates (e.g., a number of times within an interval that a number of read operations on a same page address has occurred). In some embodiments, apparatus 300 may be used to determine write rates (e.g., a number of times within an interval that a number of write operations on a same page address has occurred). In some embodiments, apparatus 300 may be used to determine hybrid access rates (e.g., a number of times within an interval that a number of write operations and a number of read operations on a same page address has occurred).

A process depicted in reference to apparatus 300 may occur during each row access strobe ("RAS") cycle. At 320, an N×k FIFO loads an N-bit page address 302. The N-bit page address 302 may include information regarding the Memory Bank and Row address of an accessed page. The N-bit page address 302 may be obtained from a page buffer (not shown) such as a SRAM page buffer, and may be associated with a VLT memory bank or VLT memory bit array (not shown). The N-bit page address 302 may contain bank and row address information associated with a VLT memory bank or VLT memory bit array. The N-bit page address 302 may be provided by a user, FSM, ASIC, processor, CPU, microcontroller, or other memory control circuitry. The N-bit page address 302 may thus contain a 3-bit Memory Bank address and a 15-bit Row address.

The N-bit page address 302 may be loaded into the N×k FIFO 320 as Entry 0 322a, Entry 1 322b, Entry 2 322c, or Entry k 322d (collectively Entries 322). In some embodiments, each FIFO Entry 322 may be a register. There may be a total of k entries loaded into the N×k FIFO 320. In some embodiments, at the beginning of or during an RAS cycle, an N-bit page address 302 may be loaded into Entry 0 322a of the N×k FIFO 320, and addresses stored at entries of the N×k FIFO 320 may shift through the N×k FIFO 320. For example, an address stored previously at Entry 0 322a may be shifted to Entry 1 322b, and an address stored previously at Entry 1 322b may be shifted to Entry 2 322c.

The N-bit page address 302 may be simultaneously or subsequently loaded into the N×k FIFO/CAM 340 (e.g., from N×k FIFO 320). In some examples, the N×k FIFO/CAM 340 may be a CAM only, or a FIFO connected CAM, or a FIFO integrated with a CAM. The N-bit page address 302 may be loaded into the N×k FIFO/CAM as FIFO/CAM Entry 0 342a, FIFO/CAM Entry 1 342b, FIFO/CAM Entry 2 342c, or FIFO/CAM Entry k 342d (collectively FIFO/CAM Entries 342). In some embodiments, each FIFO/CAM Entry 342 may be a CAM cell with a data input, a data output, a match input, and a match output. For example, each FIFO/CAM Entry 342 may be a NOR type CAM cell (e.g., a 10-T NOR type CAM cell). In some embodiments, at the beginning of or during an RAS cycle, an N-bit page address 302 may be loaded into FIFO/CAM Entry 0 342a of the N×k FIFO/CAM 340, and addresses stored at entries of the N×k FIFO/CAM 340 may shift through the N×k FIFO/CAM 340. For example, an address stored previously at FIFO/CAM Entry 0 342a may be shifted to FIFO/CAM Entry 0 342b, and an address stored previously at Entry 1 FIFO/CAM Entry 0 342b may be shifted to FIFO/CAM Entry 0 342c. Each FIFO/CAM Entry 342 may be associated with a signal line such as Match Signal $M_0$ 346a associated with FIFO/CAM Entry 0 342a, Match Signal $M_1$ 346b associated with FIFO/CAM Entry 1 342b, Match Signal $M_2$ 346c associated with FIFO/CAM Entry 2, and Match Signal $M_k$ 346d associated with FIFO/CAM Entry k 342d (collectively Match Signals 346).

In some embodiments, Match Signals 346 may be binary signals indicating if a $k^{th}$ FIFO Entry 322 is the same as any FIFO/CAM Entry 342. Thus, for example, if FIFO/CAM Entry 1 342b is identical to FIFO Entry 0 322a, Match Signal $M_1$ 346b may be non-zero. In these embodiments, a Counter 348 determines a total number of non-zero Match Signals 346, which corresponds to the total number of times a single N-bit page address 302 stored at a $k^{th}$ FIFO Entry 322 (e.g., Entry 0 322a) has been accessed during a number k of previous RAS cycles.

In some embodiments, Match Signals 346 may be binary signals indicating if a $k^{th}$ FIFO/CAM 342 is the same as any of the other FIFO/CAM Entries 342. Thus, for example, if FIFO/CAM Entry 2 is identical to FIFO/CAM Entry 0, Match Signal $M_2$ 346c may be non-zero. In these embodiments, a Counter 348 determines a total number of non-zero Match Signals 346, which corresponds to the total number of times a single N-bit page address 302 has been accessed during a number k of previous RAS cycles.

In some embodiments, Match Signals 346 may be binary signals indicating if a $k^{th}$ FIFO/CAM Entry 342 is the same as a $(k-1)^{th}$ FIFO/CAM Entry 342. Thus, for example, if FIFO/CAM Entry 1 is identical to FIFO/CAM Entry 0, Match Signal $M_1$ 346b may be non-zero. In these embodiments, a Counter 348 determines a total number of non-zero Match Signals 346, which corresponds to the total number of times a single N-bit page address 302 has been accessed during a number k of previous RAS cycles.

The Counter 348 may be any standard circuit capable of comparing and counting the k Match Signals 346. The output of the Counter 348 may be a Write Back signal 350. Write Back signal 350 may be provided to a microprocessor or other external circuitry to write back the page address whose read or write rate has exceeded the maximum read or write rate, such as X/Y or Z/t, respectively, as described with reference to FIGS. 1 and 2. The N×k FIFO/CAM 340 may also store this page address in a frequent page address memory device 344 (e.g., a register), and output the page address at 352 together with the Write Back signal 350 to the microprocessor or other external circuitry.

Thus, the apparatus 300 determines a read or write rate of the N-bit page address 302 as it is accessed during an RAS cycle. Based on this determined read or write rate, apparatus 300 can then output a Write Back signal 350 and a Page Address 352 to refresh data stored at the N-bit page address 302, if the read rates or write rates during the RAS cycle exceed maximum read rates or write rates.

Figure 4:
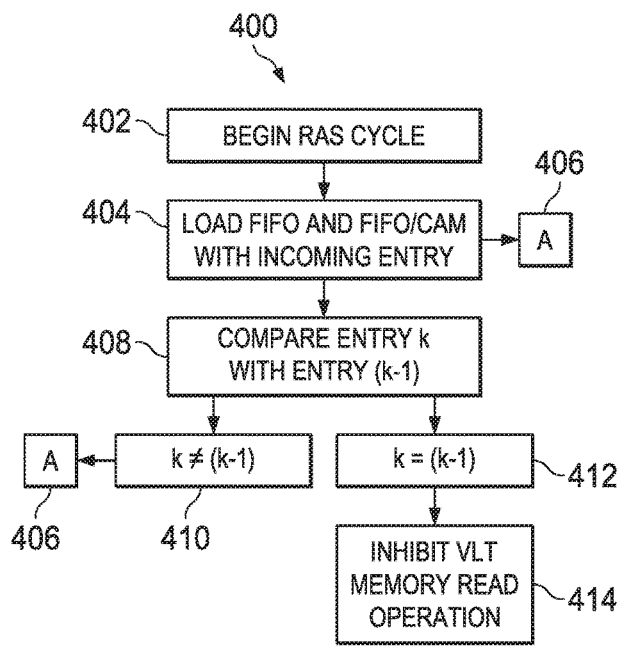
FIG. 4 depicts a flowchart of a process for loading a First-In-First-Out (FIFO) device and a FIFO/CAM device, according to an illustrative implementation.

FIG. 4 depicts a flowchart of a process for loading a FIFO device and FIFO/CAM device, according to an illustrative implementation. Process 400 may be executed by a FSM, ASIC, processor, CPU, microcontroller, or other memory control circuitry, which may be in signal communication with the cross-point memory array (e.g., control circuitry on the same semiconductor substrate as, or on, a separate semiconductor substrate from the cross-point memory array). The FIFO and FIFO/CAM referred to in FIG. 4 may be the N×k FIFO device 320 and N×k FIFO/CAM device 340, respectively, as described in FIG. 3. Process 400 may be initiated at the beginning of an RAS cycle at 402. Process 400 may then proceed to 404 and load a FIFO (e.g., 320) and a FIFO/CAM (e.g., 340) with an incoming page address entry. For example, an incoming page address (e.g., N-bit page address 302) may be loaded into N×k FIFO 320 and the N×k FIFO/CAM 340, illustrated in FIG. 3. After the incoming page address has been loaded into both the FIFO and FIFO/CAM devices, each $k^{th}$ entry may be compared with a $(k-1)^{th}$ entry within the FIFO and FIFO/CAM structures that have already been loaded. This $(k-1)^{th}$ entry may correspond, for example, to Entry 0 322a, Entry 1 322b, or Entry 2 322c within the N×k FIFO structure 320 as shown in FIG. 3. This $(k-1)^{th}$ entry may also correspond, for example, to FIFO/CAM Entry 0 342a, FIFO/CAM Entry 1 342b, FIFO/CAM Entry 2 342c within the N×k FIFO/CAM structure 340 as shown in FIG. 3. If, at 410, it is determined that the incoming page address (e.g., N-bit page address 302) is not the same as the previously accessed page address (e.g., the immediate prior N×k FIFO Entry 1 322b of the immediate prior N×k FIFO/CAM Entry 1 342b), then process 400 proceeds to 406 and may continue to load FIFO and FIFO/CAM devices with a subsequent incoming page address at 404. The comparison between entries may be carried out by any standard comparator circuitry or exterior processor. If, however, at 412, process 400 determines that the incoming page address (e.g., N-bit page address 302) loaded into FIFO Entry 0 322a or FIFO/CAM Entry 342a is the same as a previously accessed page address (e.g., the immediate prior N×k FIFO Entry 1 322b of the immediate prior N×k FIFO/CAM Entry 1 342b), then process 400 may proceed to 414 and inhibit the VLT memory read operation. In some embodiments, if, at 412, the incoming page address (e.g., N-bit page address 302) is the same as a previously accessed page address (e.g., the immediate prior N×k FIFO Entry 1 322b of the immediate prior N×k FIFO/CAM Entry 1 342b), this indicates that the data in a page buffer may either be the same as previously accessed data (e.g., in the case of a read operation), or has not yet been written back (e.g., in the case of a write operation), and there is no need to perform a VLT read operation on the same page address again. The VLT memory may be updated by writing back the data stored in the page buffer to a page corresponding to the N-bit page address at the end of the RAS cycle.

Figure 5:
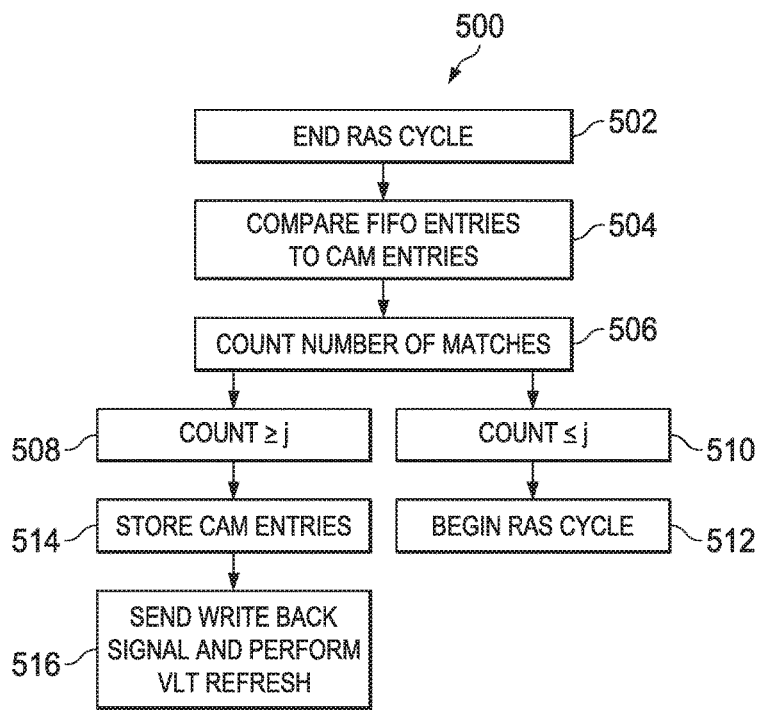
FIG. 5 depicts a flowchart of a process for determining if a refresh operation is required based on entries loaded in a FIFO device and a FIFO/CAM device, according to an illustrative implementation.
Figure 6:
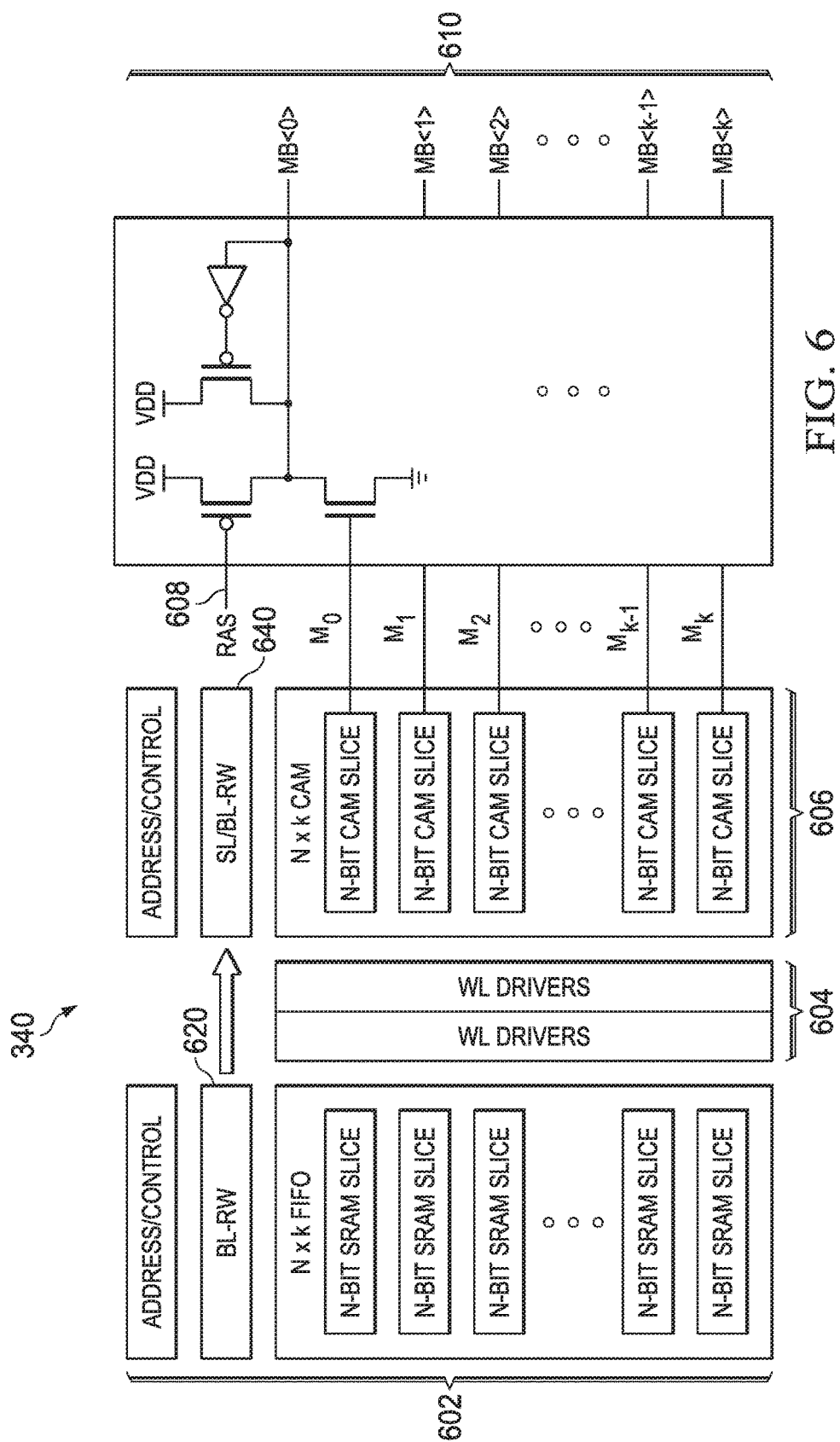
FIG. 6 depicts an example of a FIFO/CAM device, according to an illustrative implementation.

FIG. 5 depicts a flowchart of a process for determining if a refresh operation is required based on entries loaded in a FIFO device and a FIFO/CAM device, according to an illustrative implementation. Process 500 may be executed by a FSM, ASIC, processor, CPU, microcontroller, or other memory control circuitry, which may be in signal communication with the cross-point memory array (e.g., control circuitry on the same semiconductor substrate as, or on, a separate semiconductor substrate from the cross-point memory array). Process 500 may be initiated by the end of the RAS cycle at 502. The end of the RAS cycle at 502 may correspond to the end of a precharge cycle. For example, process 500 may be initiated by the end of process 400 of FIG. 4. In some embodiments, process 500 may thus occur when the Incoming Entries 322 and FIFO/CAM Entries 342 have been populated with N-bit page addresses of accessed page addresses during a prior number of RAS cycles. In some examples, 504 may begin immediately after the determination at 410 as shown in FIG. 4, such that the end of the RAS Cycle 502 occurs after 504, 506, 508, 510, 512, 514, and/or 516. In some examples, 504 may begin immediately after the determination at 412, such that the end of the RAS Cycle 502 occurs after 504, 506, 508, 510, 512, 514, and/or 516. In some examples, 504 may begin immediately after the determination at 408, such that the end of the RAS Cycle 502 occurs after 506, 508, 510, 512, 514, and/or 516. At 504, Process 500 may compare an incoming page address (e.g., N-bit page address 302), which may be stored at FIFO Entry 322a, with all FIFO/CAM entries 342 within the N×k FIFO/CAM structure 340. The FIFO entries 322 within the N×k FIFO device 320 may be shown in FIFO device 602, while the FIFO/CAM entries in the N×k FIFO/CAM device 340 may be the CAM device 606 as shown in FIG. 6. CAM device 606 may be a CAM only, a FIFO connected CAM, or a FIFO integrated with a CAM. The comparison may be implemented using Word-Line (WL) Drivers 604, as shown in FIG. 6, and/or Match registers. 504 may correspond to the production of Match Signals 346, as shown in FIG. 3. Process 500 then counts the total number of matches at 506, which may correspond to the total number of times that a single N-bit page address has been accessed during a number k of previous RAS cycles. 506 may be carried out using the Counter 348 as shown in FIG. 3. The Counter 348 may be further described with reference to FIG. 7.

At 508, the process 500 determines if the number of matches from 506 is greater than or equal to a value j, where j is the maximum number of times an N-bit page address may be accessed for reading and/or writing during a number k of previous RAS cycles without resulting in irrecoverable memory loss. The value of j may be X, as described with reference to FIG. 1. The value of j may be Z, as described with reference to FIG. 2. If, at 508, the process 500 determines that the value of j has exceeded or reached a threshold (e.g., X of FIG. 3 or Z of FIG. 4), then process 500 may proceed to 514 and may store the incoming page address at the frequent page address memory device 344. The stored information may be the Memory Bank address and/or the Row address, or the incoming N-bit page address 302. The frequent page address memory device 344 may be part of the CAM structure 606, as described in FIG. 6. Then, at 516, the process 500 may send a write back signal and may perform a VLT refresh for the N-bit page address that has been accessed a number equal to or greater than the maximum value of j times within a number k of previous RAS cycles. At 516, Write Back signal 350, as shown in FIG. 3, may be output (e.g., by counter 348). Write Back 516 may occur simultaneously with the beginning of a precharge cycle. 516 may occur before a new RAS cycle is begun. Performing a VLT refresh may correspond to using the output Page Address 352 as shown in FIG. 3, which together with the Write Back Signal may be directed to a microprocessor or other external circuitry, which may refresh the N-bit page address.

At 510, if it is determined that the number of matches, and therefore the number of times a page address has been accessed, is below the maximum value of j, then process 500 may begin the next RAS cycle at 512.

FIG. 6 depicts an example of a FIFO/CAM device, according to an illustrative implementation. FIG. 6 may depict the FIFO/CAM device 340, as shown in FIG. 3. The N×k FIFO 602 is in communication with the N×k CAM 606 via Word-Line (WL) Drivers 604. In some embodiments, as each page address entry is received and stored into the N×k FIFO 602, it is transferred through BL-RW 620 to the Source Line Read/Write (SL-RW) 640 and N×k CAM 606 using BL-RW 620 to determine if there is a match within the CAM structure 606. SL may be the source line of the CAM cell, and the SL-RW may be the read/write circuitry used to drive differential SLs. Similarly, BL-RW 620 may be the BL read/write circuitry used to drive the differential BLs. The SL-RW 640 and BL-RW 620 may be described in Rabaey et al., "Digital Integrated Circuits," 2d Ed., 2003, which is hereby incorporated by reference herein in its entirety. Each CAM structure 606 may include a 10-T NOR type CAM cell which may output a match $M_k$ signal, which is high when a target bit matches a bit stored in the CAM cell, and which is low when a target bit does not match a bit stored in the CAM cell. CAM cells may be described in Rabaey et al., "Digital Integrated Circuits," 2d Ed., 2003, which is hereby incorporated by reference herein in its entirety. A Precharger 608 may precharge each of the $M_k$ signal lines at the end of each RAS cycle. Match Signal structure 610 may take as input each of the $M_k$ signals, and may invert the $M_k$ signals and then output match signals (MB<0>-MB<k>), which may be sent to a counter, as described in further detail with reference to FIG. 7.

Figure 7:
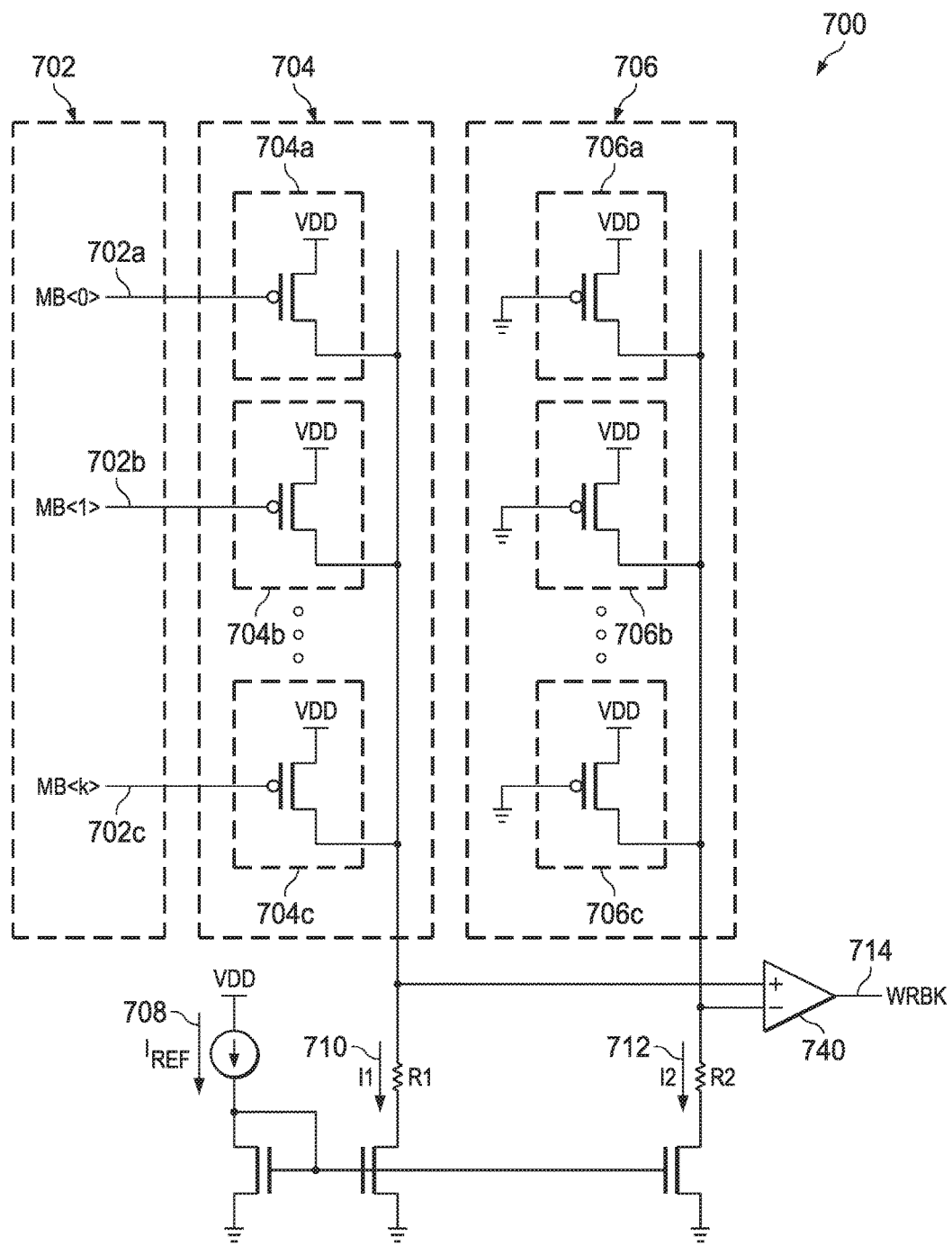
FIG. 7 depicts a circuit diagram of a page address counter, according to an illustrative implementation.

FIG. 7 depicts a circuit diagram of a page address counter 700, according to an illustrative implementation. The page address counter may 700 may determine a total number of times a page address has been accessed during an RAS cycle, and may output a write-back ("WRBK") signal at 714 if the address count is greater than a maximum value j for page address access. In some embodiments, this maximum value j may correspond to maximum read value X as described in FIG. 1. In some embodiments, this maximum value j may also correspond to maximum write value Z as described in FIG. 2. Input Match Signal Array 702 may take as inputs the output signal of the Match Signal structure 610 as shown in FIG. 6. The Input Match Signals in the Input Match Signal Array 702, such as MB<0> 702a, MB<1> 702b, through MB<k> 702c, may be high if there is no match associated with a page address. The Input Match Signals in the Input Match Signal Array 702, such as MB<0> 702a, MB<1> 702b, through MB<k> 702c, may each be low if there is a match associated with a page address. Each Input Match Signal in the Input Match Signal array 702 is connected to a transistor in the array of Match Transistors 704. Thus, Input Match Signal MB<0> is coupled to transistor 704a, Input Match Signal MB<1> is coupled to transistor 704b, Input Match Signal MB<k> is coupled to transistor 704c. As referred to herein, the term "coupled to" may be understood to refer to directly or indirectly connected to (e.g., through an electrical connection). Each of the transistors in the Match Transistor Array 704 may be a PMOS transistor. In some embodiments, each of the transistors in the Match Transistor array 704 may be an NMOS transistor. The Match Transistor Array 702 generates current I1 710 across resistor R1. The Comparator Transistor Array 706, composed of transistors 706a, 706b, 706c, will generate current I2 across resistor R2. $I_{REF}$ 708 may be a temperature-independent reference current source, derived from a temperature independent analog circuit (not shown). The number of transistors in the Comparator Transistor Array 706 may be j−1, where j is the maximum number of times a page address may be accessed during an RAS cycle. The number of transistors in the Comparator Transistor Array 706 may not be the same as the number of transistors in the Match Transistor array 704. If I1 710 is greater than I2, then the comparator 740 may output a "High" WRBK signal 714, indicating that a page corresponding to the page address is to be refreshed before further read or write functions can be performed. If I1 is less than I2, then the comparator 700 will output a "Low" WRBK signal 714, indicating that a page corresponding to the page address does not need to be refreshed before further read or write functions are performed. A pull-down device (not shown) may be used to disable current source 708 when not in use.

This description has been presented for the purposes of illustration. It is not intended to be exhaustive or to limit the invention to the precise form described, and many modifications and variations are possible in light of the teaching above. For example, although the aforementioned discussions related to VLT-RAMs, it should be understood that the aforementioned discussions could also relate to other types of memory technology. Where the aforementioned discussions referred to PMOS devices, NMOS devices may be used when modified accordingly. The figures are not drawn to scale and are for illustrative purposes. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method for refreshing data from a cross-point memory array, the method comprising:
    loading, into a first entry of a First-In-First-Out (FIFO) device, a first page address of a corresponding page to be accessed by an access operation on a memory device;
    loading, into a first entry of a Content Addressable Memory (CAM) device, the first page address;
    comparing the first page address loaded into the first entry of the CAM device and a second page address loaded into a second entry of the CAM device;
    if, based on the comparing the first page address and the second page address, the first page address loaded into the first entry of the CAM device matches the second page address loaded into the second entry of the CAM device, inhibiting the access operation of the first page; and
    if, based on the comparing, the first page address loaded into the first entry of the CAM device matches the second page address loaded into the second entry of the CAM device:
        comparing the first page address loaded into the first entry of the FIFO device with a respective address loaded at each entry of the CAM device;
        if, based on the comparing the first page address with the respective address loaded at each entry of the CAM device, a number of matches between the first page address and one or more respective addresses loaded at each entry of the CAM device is greater than a first threshold, refreshing data stored within a page corresponding to the first page address.

2. The method of claim 1, wherein the memory device comprises a cross-point memory array of thyristor memory cells.

3. The method of claim 2, wherein the access operation is a write operation, the method further comprising:
    if the number of matches between the first page address and the one or more respective addresses loaded at each entry of the CAM device is greater than the first threshold:
        delaying a period of time corresponding to a relaxation time of a thyristor memory cell of the cross-point memory array; and writing data stored in a page buffer to the page of the memory device corresponding to the first page address.

4. The method of claim 1, wherein the access operation is a read operation, the method further comprising:
subsequent to inhibiting the access operation of the page, accessing data corresponding to the first page address from a page buffer.

5. The method of claim 1, wherein the access operation is a read operation, the method further comprising:
writing data stored in a page buffer to the page of the memory device corresponding to the first page address, if the number of matches between the first page address and the one or more respective addresses loaded at each entry of the CAM device is greater than the first threshold.

6. The method of claim 1, wherein refreshing data stored within a page corresponding to the first page address comprises refreshing the data stored within the page corresponding to the first page address to the memory device accessed by the access operation.

7. The method of claim 1, wherein the threshold comprises number of times the corresponding page has been accessed by an access operation on the memory device.

8. The method of claim 1, wherein the number of matches between the first page address and one or more respective addresses loaded at each entry of the CAM device comprises a number of times the corresponding page has been accessed by the access operation on the memory device.

9. A system for refreshing data from a cross-point memory array, the system comprising:
a First-In-First-Out (FIFO) device comprising a plurality of entries for storing a plurality of page address;
a Content Addressable Memory (CAM) device comprising a plurality of entries for storing a plurality of page addresses, wherein each entry comprises a match output line; and
a comparator configured to output a write-back signal;
a page address counter comprising:
an array of match transistors coupled to a first input of the comparator;
an array of comparator transistors coupled to a second input of the comparator, wherein a count of comparator transistors in the array of comparator transistors is less than a count of match transistors in the array of match transistors.

10. The system of claim 9, wherein each match transistor of the array of match transistors is coupled to a respective match output line of a respective entry of the CAM device.

11. The system of claim 9, wherein each entry of the CAM device comprises a NOR type CAM cell.

* * * * *